(12) United States Patent
Takei et al.

(10) Patent No.: US 7,432,710 B2
(45) Date of Patent: Oct. 7, 2008

(54) APPARATUS AND METHOD FOR REDUCING IMAGE ARTIFACT

(75) Inventors: Naoyuki Takei, Tokyo (JP); Tetsuji Tsukamoto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 12 days.

(21) Appl. No.: 11/538,878

(22) Filed: Oct. 5, 2006

(65) Prior Publication Data

US 2007/0080690 A1    Apr. 12, 2007

(30) Foreign Application Priority Data

Oct. 7, 2005    (JP) ............... 2005-295262

(51) Int. Cl.
*G01V 3/00*    (2006.01)
(52) U.S. Cl. .................................... 324/318
(58) Field of Classification Search ......... 324/300–322; 600/410–435
See application file for complete search history.

(56) References Cited

U.S. PATENT DOCUMENTS

| | | | |
|---|---|---|---|
| 4,994,744 A | 2/1991 | Glover et al. | |
| 5,251,128 A | 10/1993 | Crawford | |
| 5,287,276 A | 2/1994 | Crawford et al. | |
| 5,382,902 A | 1/1995 | Taniguchi et al. | |
| 5,923,770 A | 7/1999 | O'Donnell et al. | |
| 6,067,465 A | 5/2000 | Foo et al. | |
| 6,073,041 A * | 6/2000 | Hu et al. | 600/410 |
| 6,201,393 B1 | 3/2001 | Bernstein et al. | |
| 6,426,990 B1 | 7/2002 | Cesmeli | |
| 6,718,004 B2 | 4/2004 | Cesmeli | |
| 7,012,428 B1 | 3/2006 | Ward et al. | |
| 7,012,603 B2 | 3/2006 | Chen et al. | |
| 7,174,200 B2 * | 2/2007 | Salerno et al. | 600/420 |

FOREIGN PATENT DOCUMENTS

| | | |
|---|---|---|
| JP | 10-277010 | 10/1998 |
| JP | 2002-102201 | 4/2002 |

* cited by examiner

*Primary Examiner*—Dixomara Vargas
(74) *Attorney, Agent, or Firm*—Armstrong Teasdale LLP

(57) ABSTRACT

For the purpose of preventing development of motion artifacts and improving image quality, a first displacement N1 of the diaphragm before a scanning section 2 performs an imaging sequence and a second displacement N2 of the diaphragm after the scanning section 2 has performed the imaging sequence are detected by a body motion detecting section 25 as displacement caused by respiratory motion of a subject. Thereafter, based on the first displacement N1 and second displacement N2 of the diaphragm detected by the body motion detecting section 25, imaging data is selected as raw data by a raw data selecting section 26. Then, based on the imaging data selected as raw data by the raw data selecting section 26, a slice image of the subject is produced by an image producing section 31.

20 Claims, 7 Drawing Sheets

APPARATUS AND METHOD FOR REDUCING IMAGE ARTIFACT

CROSS REFERENCE TO RELATED APPLICATIONS

This application claims the benefit of Japanese Application No. 2005-295262 filed Oct. 7, 2005.

BACKGROUND OF THE INVENTION

The present invention relates to a magnetic resonance imaging apparatus.

Magnetic resonance imaging (MRI) apparatuses are widely used in various fields including a medical application and an industrial application.

A magnetic resonance imaging apparatus emits an electromagnetic wave toward a subject in a static magnetic field space to thereby excite spins of protons in the subject with a nuclear magnetic resonance (NMR) phenomenon, and conducts a scan to acquire magnetic resonance (MR) signals generated by the excited spins. The magnetic resonance signals acquired in the scan are used as raw data for a slice image to produce a slice image of the subject.

In such a scan on a subject using the magnetic resonance imaging apparatus, if the subject move, motion artifacts may appear in a produced slice image. For example, when the heart or abdomen of the subject is imaged, body motion such as respiratory or cardiac motion leads to development of motion artifacts and degenerates image quality.

To prevent such image quality degeneration due to motion artifacts, there is proposed a method of conducting a scan in synchronization with body motion such as respiratory or cardiac motion (see Patent Document 1, for example).

[Patent Document 1] Japanese Patent Application Laid Open No. H10-277010

[Patent Document 2] Japanese Patent Application Laid Open No. 2002-102201

In such a method, a displacement caused by cyclic cardiac motion is detected as electrocardiographic signals, for example, and the magnetic resonance imaging apparatus repetitively scans the subject at a specific phase of cardiac motion of the subject based on the electrocardiographic signals. In the scan, first, a region containing the diaphragm, for example, is selectively excited to monitor respiratory motion of the subject, and a navigator sequence is performed to acquire magnetic resonance signals as navigator echo data. Subsequent to the navigator sequence, an imaging sequence is performed to acquire magnetic resonance signals as imaging data from a slice position at which a slice image is to be produced. At that time, if a displacement of the diaphragm obtained by the navigator sequence falls within a predefined acceptance window, the imaging data acquired by the subsequent imaging sequence is selected as raw data for the slice image to sequentially fill a k-space. In particular, since the heart rate of the subject is generally of the order of sixty beats per minute, navigator echo data and imaging data are acquired in a cycle of one second, and imaging data that is acquired when a displacement of the diaphragm obtained by the navigator echo data falls within a predefined acceptance window is selected as raw data, which is for use as a material for a slice image. A slice image is then reconstructed based on the imaging data selected as raw data.

However, when respiratory motion becomes arrhythmic, i.e., for example, when the depth of respiration is significantly disturbed and varies, the diaphragm may lie at a position different from that in cyclic respiratory motion in performing the imaging sequence, even though a displacement of the diaphragm obtained by the navigator sequence performed before the imaging sequence falls within the predefined acceptance window. In such a case, motion artifacts may appear, thus leading to degeneration of image quality.

As described above, according to the conventional techniques, development of motion artifacts cannot be sufficiently suppressed and it is difficult to improve image quality.

SUMMARY OF THE INVENTION

Therefore, an object of the present invention is therefore to provide a magnetic resonance imaging apparatus capable of suppressing development of motion artifacts and improving image quality.

[Means for Solving the Problem]

To attain the aforementioned object, the present invention provides a magnetic resonance imaging apparatus comprising: a scanning section for repetitively performing an imaging sequence in which an electromagnetic wave is emitted toward a subject in a static magnetic field space to excite an imaged region in said subject, and magnetic resonance signals generated in said imaged region in said subject are acquired as imaging data; a body motion detecting section for repetitively detecting a displacement caused by body motion of said subject each time said scanning section performs said imaging sequence; a raw data selecting section for selecting said imaging data acquired by said scanning section performing said imaging sequence as raw data based on the displacement caused by body motion of said subject detected by said body motion detecting section; and an image producing section for producing an image of said subject based on said imaging data selected as raw data by said raw data selecting section, wherein said body motion detecting section detects, as the displacement caused by body motion of said subject, a first displacement before said scanning section performs an imaging sequence and a second displacement after said scanning section has performed the imaging sequence, and said raw data selecting section selects said imaging data as raw data based on said first displacement and said second displacement detected by said body motion detecting section.

According to the present invention, there is provided a magnetic resonance imaging apparatus capable of suppressing development of motion artifacts and improving image quality.

Further objects and advantages of the present invention will be apparent from the following description of the preferred embodiments of the invention as illustrated in the accompanying drawings.

DETAILED DESCRIPTION OF THE INVENTION

An exemplary embodiment of the present invention will now be described with reference to the accompanying drawings.

Figure 1:
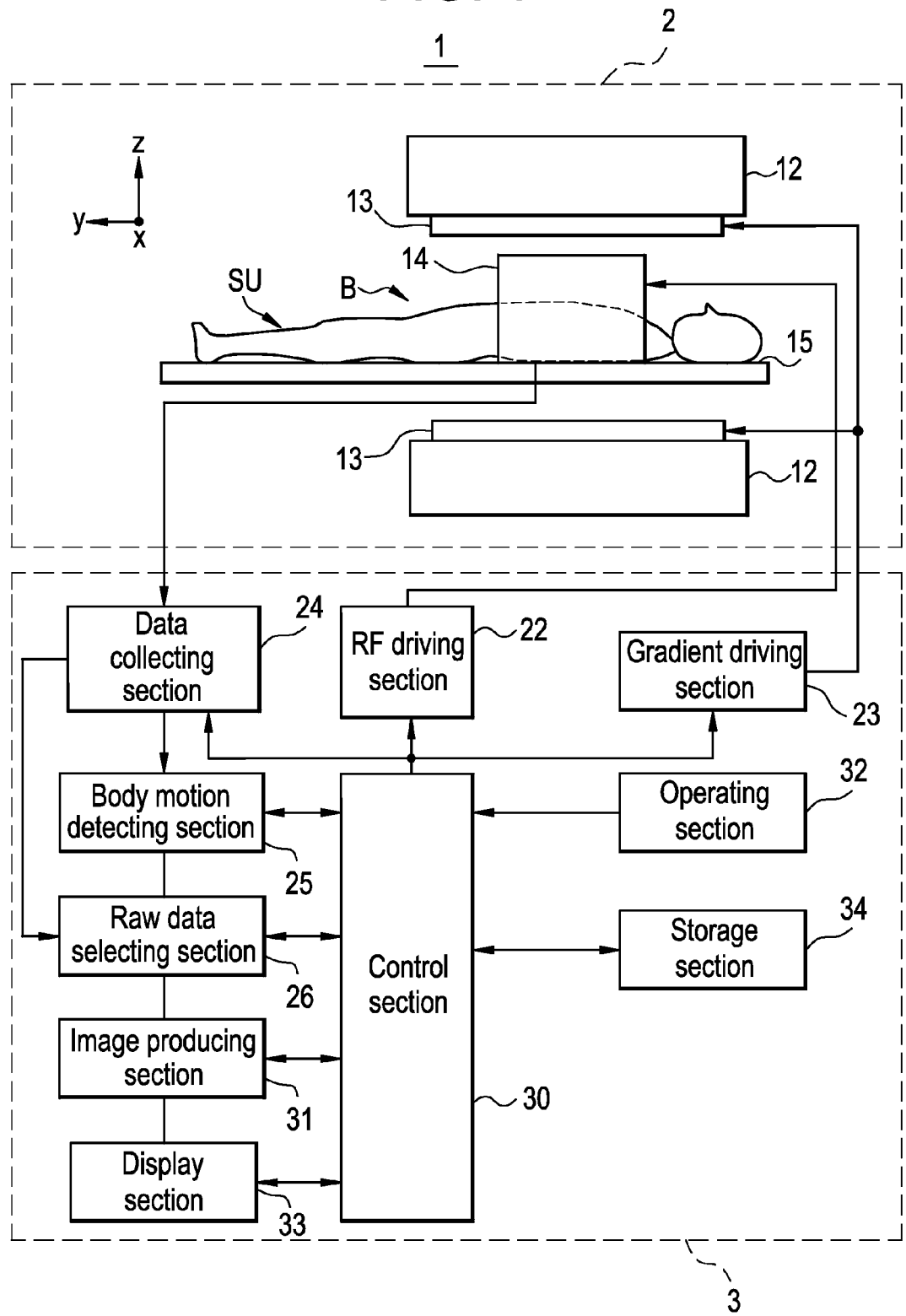
FIG. 1 is a block diagram showing the configuration of a magnetic resonance imaging apparatus 1 in an embodiment in accordance with the present invention.

FIG. 1 is a block diagram showing the configuration of a magnetic resonance imaging apparatus 1 in an embodiment in accordance with the present invention.

As shown in FIG. 1, the magnetic resonance imaging apparatus 1 has a scanning section 2 and an operation console section 3.

Now the scanning section 2 will be described.

The scanning section 2 has a static magnetic field magnet section 12, a gradient coil section 13, an RF coil section 14, and a cradle 15, as shown in FIG. 1, for emitting an electromagnetic wave toward a subject SU to excite an imaged region in the subject SU in an imaging space B in which a static magnetic field is generated, and conducting a scan to acquire magnetic resonance signals generated in the imaged region in the subject SU.

In the present embodiment, the scanning section 2 repetitively scans the subject SU at a specific phase of cardiac motion of the subject SU based on electrocardiographic signals detected by a body motion detecting section 25, which will be described later, in the operation console section 3.

In the scan, first, a region containing the diaphragm is selectively excited to monitor respiratory motion of the subject SU, and a first navigator sequence is performed to acquire magnetic resonance signals as first navigator echo data. Subsequent to the first navigator sequence, an imaging sequence is performed to acquire magnetic resonance signals as imaging data from a slice position at which a slice image is to be produced. Then, a second navigator sequence is performed again to acquire magnetic resonance signals in the region containing the diaphragm as second navigator echo data. At that time, the scanning section 2 sequentially and repetitively performs the first navigator sequence, imaging sequence and second navigator sequence for every cardiac cycle of the subject SU at the same phase in that cardiac cycle.

The components in the scanning section 2 will now be described one by one.

The static magnetic field magnet section 12 is comprised of, for example, a pair of permanent magnets to generate a static magnetic field in the imaging space B receiving the subject SU. The static magnetic field magnet section 12 here generates the static magnetic field such that the direction of the static magnetic field aligns with a direction Z that is perpendicular to the body axis direction of the subject SU. Alternatively, the static magnetic field magnet section 12 may be comprised of a superconductive magnet.

The gradient coil section 13 generates a gradient magnetic field in the imaging space B in which the static magnetic field is generated, to add spatial positional information to magnetic resonance signals received by the RF coil section 14. The gradient coil section 13 here is comprised of three coil systems of x-, y- and z-directions to generate gradient magnetic fields in a frequency encoding direction, a phase encoding direction, and a slice selective direction, depending upon imaging conditions. In particular, the gradient coil section 13 applies a gradient magnetic field in the slice selective direction of the subject SU to select a slice through the subject SU to be excited by the RF coil section 14 transmitting an RF pulse. The gradient coil 13 also applies a gradient magnetic field in the phase encoding direction of the subject SU to phase-encode magnetic resonance signals from the slice excited by the RF pulse. The gradient coil section 13 moreover applies a gradient magnetic field in the frequency encoding direction of the subject SU to frequency-encode magnetic resonance signals from the slice excited by the RF pulse.

The RF coil section 14 is disposed to surround the imaged region in the subject SU, as shown in FIG. 1. The RF coil section 14 transmits an RF pulse, which is an electromagnetic wave, to the subject SU in the imaging space B in which the static magnetic field is generated by the static magnetic field magnet section 12, to generate a high frequency magnetic field and excite spins of protons within the imaged region in the subject SU. The RF coil section 14 then receives an electromagnetic wave generated by the excited protons in the subject SU as magnetic resonance signals.

The cradle 15 has a table for laying thereon the subject SU. The cradle section 26 is moved between the inside and outside of the imaging space B based on a control signal from the control section 30.

Now the operation console section 3 will be described.

The operation console section 3 has an RF driving section 22, a gradient driving section 23, a data collecting section 24, a body motion detecting section 25, a raw data selecting section 26, a control section 30, an image producing section 31, an operating section 32, a display section 33, and a storage section 34, as shown in FIG. 1.

The components in the operation console section 3 will now be described one by one.

The RF driving section 22 drives the RF coil section 14 to transmit an RF pulse for generating a high frequency magnetic field in the imaging space B. The RF driving section 22 modulates a signal from an RF oscillator into a signal of predetermined timing and envelope using a gate modulator based on a control signal from the control section 30, and then amplifies the signal modulated by the gate modulator at an RF power amplifier and outputs it to the RF coil section 14, thus transmitting the RF pulse.

The gradient driving section 23 applies a gradient pulse to the gradient coil section 13 and drives the section 13 based on a control signal from the control section 30, to generate a gradient magnetic field in the imaging space B in which the static magnetic field is generated. The gradient driving section 23 has three driving circuits (not shown) corresponding to the three systems of the gradient coil section 13.

The data collecting section 24 collects magnetic resonance signals received by the RF coil section 14 based on a control signal from the control section 30. The data collecting section 24 here has a phase detector that phase-detects magnetic resonance signals received by the RF coil section 14 with reference to the output from the RF oscillator in the RF driving section 22. Thereafter, an A/D converter is used to convert the magnetic resonance signals, which are analog signals, into digital signals and output them.

In the present embodiment, the data collecting section 24 outputs magnetic resonance signals acquired as imaging data by the imaging sequence performed by the scanning section 2 to the raw data selecting section 26 in the operation console 3. Moreover, the data collecting section 24 outputs magnetic resonance signals acquired as first navigator echo data by the first navigator sequence performed by the scanning section 2 and magnetic resonance signals acquired as second navigator echo data by the second navigator sequence to the body motion detecting section 25 in the operation console 3.

The body motion detecting section 25 has a computer and a program for causing the computer to execute a predetermined operation, and executes data processing for detecting a displacement caused by body motion of the subject SU each time the scanning section 2 performs the imaging sequence.

In the present embodiment, the body motion detecting section 25 detects a displacement caused by cardiac motion of the subject SU by an electrocardiograph.

Along with this operation, the body motion detecting section 25 detects, as displacement caused by respiratory motion of the subject SU, a first displacement before the scanning section 2 performs the imaging sequence and a second displacement after the scanning section has performed the imaging sequence. The body motion detecting section 25 here repetitively detects the first displacement and second displacement of the diaphragm of the subject SU, which varies with respiratory motion before and after the imaging sequence, for each cardiac cycle of the subject SU at the same phase in that cardiac cycle.

In particular, the body motion detecting section 25 detects a displacement of the diaphragm moved by respiratory motion before the scanning section 2 performs the imaging sequence as the first displacement based on the first navigator echo data acquired by the scanning section 2 performing the first navigator sequence. The body motion detecting section 25 also detects a displacement of the diaphragm moved by respiratory motion after the scanning section 2 has performed the imaging sequence as the second displacement based on the second navigator echo data acquired by the scanning section 2 performing the second navigator sequence.

The raw data selecting section 26 has a computer and a program for causing the computer to execute a predetermined operation, and executes data processing for selecting imaging data acquired by the scanning section 2 performing the imaging sequence as raw data based on a displacement caused by body motion of the subject SU detected by the body motion detecting section 25.

The raw data selecting section 26 here selects imaging data acquired in the current scan as raw data based on the first displacement and second displacement of the subject SU caused by respiratory motion detected by the body motion detecting section 25 as described above. For example, if the first displacement and second displacement of the subject SU when acquiring imaging data fall within a predetermined acceptance window, and an absolute value of a difference between the first displacement and second displacement falls within a predetermined threshold value, the raw data selecting section 26 selects the imaging data as raw data in that scan.

The control section 30 has a computer and a program for causing the relevant components to execute an operation corresponding to a predetermined scan using the computer, and controls the relevant components. The control section 30 here is supplied with operation data from the operating section 32, and based on the operation data supplied from the operating section 32, outputs for control a control signal to the RF driving section 22, gradient driving section 23, and data collecting section 24 to conduct a predetermined scan, and outputs for control a control signal to the body motion detecting section 25, image producing section 31, display section 33, and storage section 34.

The image producing section 31 has a computer and a program for executing predetermined data processing using the computer, and reconstructs a slice image for a slice through the subject SU from imaging data selected as raw data by the raw data selecting section 26, based on a control signal from the control section 30. The image producing section 31 then outputs the produced image to the display section 33.

The operating section 32 is comprised of operation devices such as a keyboard and a pointing device. The operating section 32 is supplied with operation data by the operator, and outputs the operation data to the control section 30.

The display section 33 is comprised of a display device such as a CRT, and displays an image on its display screen based on a control signal from the control section 30. For example, the display section 33 displays on the display screen a plurality of images with respect to items of operation data to be input by the operator via the operating section 32. The display section 33 also receives from the image producing section 31 data for a slice image of the subject SU generated based on magnetic resonance signals from the subject SU, and displays the slice image on the display screen.

The storage section 34 is comprised of a memory, and stores several kinds of data. The storage device 33 has the stored data accessed by the control section 30 as needed.

Now an operation in imaging the subject SU using the magnetic resonance imaging apparatus 1 of the aforementioned embodiment in accordance with the present invention will be described hereinbelow.

Figure 2:
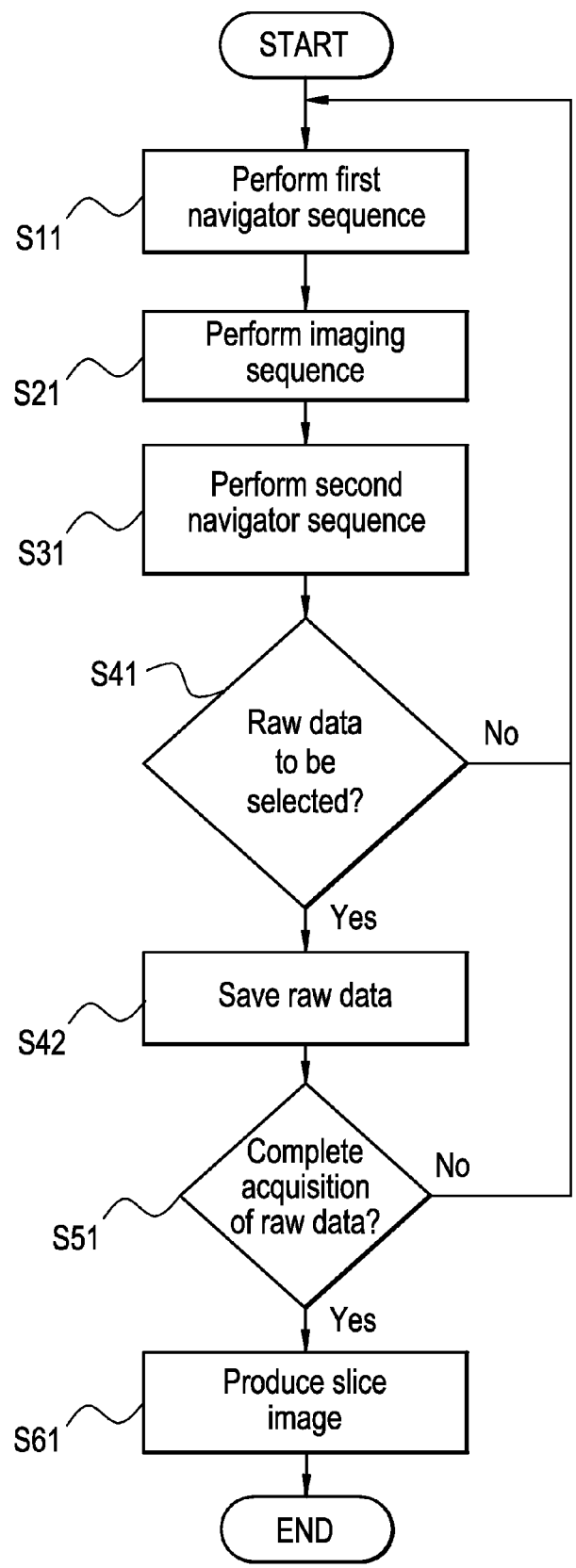
FIG. 2 is a flow chart showing an operation in imaging the subject SU in the present embodiment.
Figure 3:
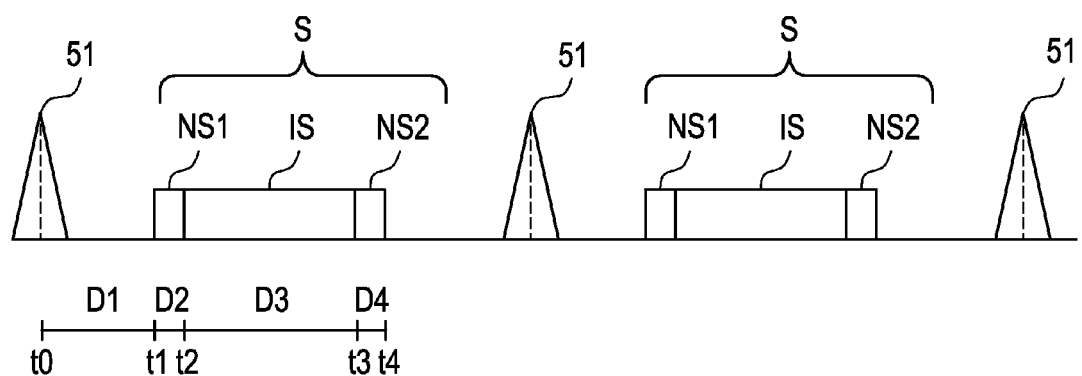
FIG. 3 is a sequence chart depicting a sequence in scanning the subject SU in the present embodiment, wherein the horizontal axis represents a time axis t.

FIG. 2 is a flow chart showing an operation in imaging the subject SU in the present embodiment. FIG. 3 is a sequence chart depicting a sequence in scanning the subject SU in the present embodiment, wherein the horizontal axis represents a time axis t.

In the present embodiment, the scanning section 2 repetitively conducts a scan S on the subject SU at a specific phase of cardiac motion of the subject SU based on electrocardiographic signals detected by the body motion detecting section 25, to acquire magnetic resonance signals for use as raw data in producing a slice image. In particular, as shown in FIG. 3, an R-wave 51 is detected in an electrocardiographic signal detected by the body motion detecting section 25, and the scanning section 2 periodically and repetitively starts the scan on the thorax of the subject SU at a time point t1 corresponding to systole after a predetermined delay time D1 from a time point t0 at which the R-wave 51 is detected.

In conducting the scan S, a first navigator sequence NS1 is initially performed (S11), as shown in FIGS. 2 and 3.

Specifically, to monitor respiratory motion of the subject SU, the scanning section 2 selectively excites spins in a region containing the diaphragm, and performs the first navigator sequence NS1 to acquire magnetic resonance signals as first navigator echo data according to a spin echo technique. The first navigator sequence NS1 is performed in a period from the time point t1 after the predetermined delay time D1 from the time point t0 at which the R-wave 51 is detected, to a time point t2 after a predetermined time D2 therefrom, as shown in FIG. 3.

Figure 4:
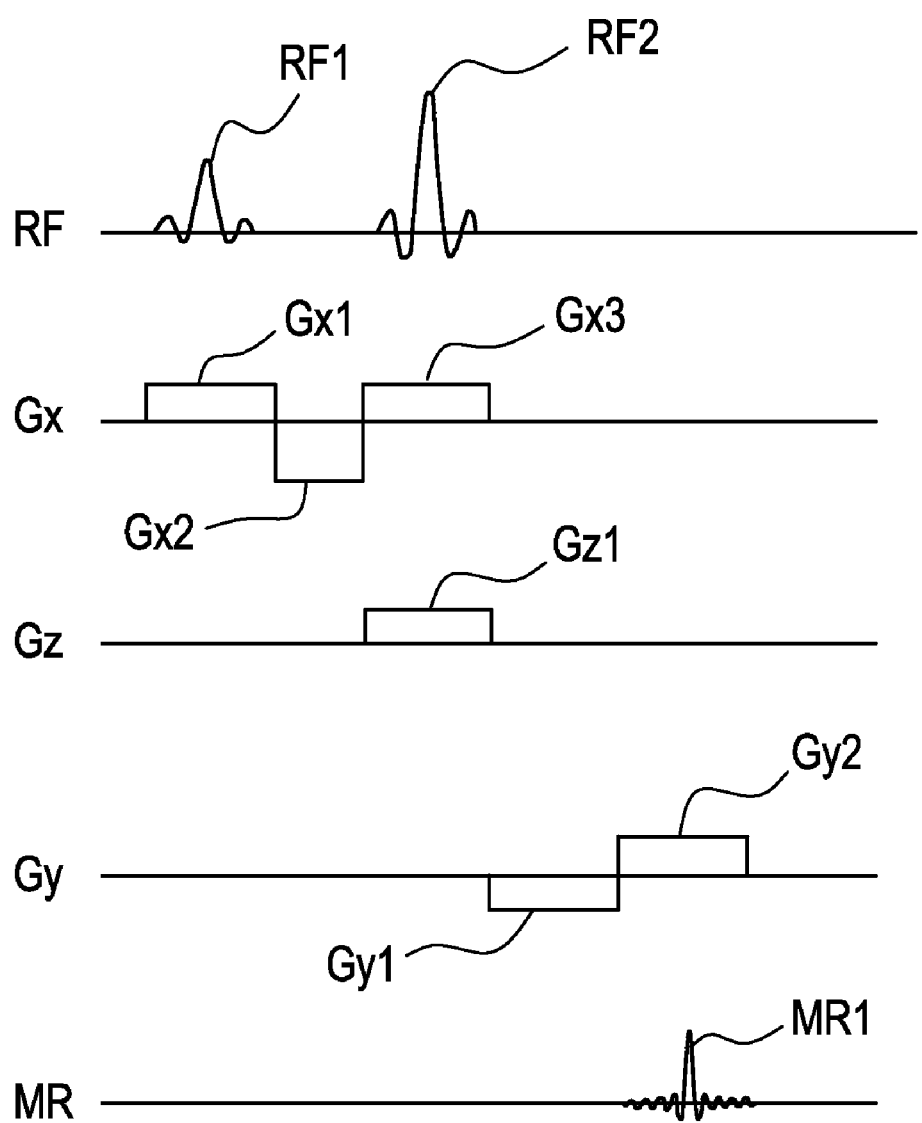
FIG. 4 is a pulse sequence chart depicting a first navigator sequence NS1 in the present embodiment.

FIG. 4 is a pulse sequence chart depicting the first navigator sequence NS1. In FIG. 4, an RF pulse RF, a gradient magnetic field Gx in an x direction, a gradient magnetic field Gz in a z direction, and a gradient magnetic field Gy in a y direction are shown. In the drawing, the vertical axis represents intensity, and the horizontal axis represents a time axis.

In performing the first navigator sequence NS1, first, as shown in FIG. 4, a first x-gradient magnetic field Gx1 is applied along with a 90° pulse RF1 to thereby selectively 90°-excite a first slice plane containing the diaphragm of the subject. Thereafter, a second x-gradient magnetic field Gx2 is applied to the subject to rewind the phase, and a third x-gradient magnetic field Gx3 and a first z-gradient magnetic field Gz1 are applied along with a 180° pulse RF2 to thereby 180°-excite a second slice plane intersecting the first slice plane in the region containing the diaphragm. Then, first and second y-gradient magnetic fields Gy1 and Gy2 are applied for frequency encoding, and a magnetic resonance signal MR1 from a region at which the first slice plane intersects the second slice plane in the subject is acquired as first navigator echo data.

The magnetic resonance signal MR1 acquired as first navigator echo data by performing the first navigator sequence NS1 is then collected by the data collecting section 24 and output to the body motion detecting section 25.

Next, as shown in FIGS. 2 and 3, an imaging sequence IS is performed (S21).

Specifically, subsequent to the first navigator sequence NS1, the scanning section 2 performs the imaging sequence IS for acquiring magnetic resonance signals as imaging data from a slice position in the thorax of the subject SU at which a slice image is to be produced. For example, the scanning section 2 performs the imaging sequence IS according to a gradient echo technique. The imaging sequence IS is performed in a period from the time point t2 at which the first navigator sequence NS1 is completed to a time point t3 after a predetermined time D3 therefrom, as shown in FIG. 3.

The magnetic resonance signals acquired as imaging data by performing the imaging sequence IS are then collected by the data collecting section 24, and output to the raw data selecting section 26.

Next, as shown in FIGS. 2 and 3, a second navigator sequence NS2 is performed (S31).

Specifically, similarly to the first navigator sequence NS1, the scanning section 2 performs the second navigator sequence NS2 to acquire a magnetic resonance signal in the region containing the diaphragm as second navigator echo data. The second navigator sequence NS2 is performed in a period from a time point t3 at which the imaging sequence IS is completed to a time point t4 after a predetermined time D4 therefrom, as shown in FIG. 3.

The magnetic resonance signal acquired as second navigator echo data by performing the second navigator sequence NS2 is then collected by the data collecting section 24, and output to the body motion detecting section 25.

Next, a decision is made as to whether raw data should be selected, as shown in FIG. 2 (S41).

Specifically, a decision is made as to whether the raw data selecting section 26 is should select, as raw data, the imaging data acquired by the scanning section 2 performing the imaging sequence IS in each scan, based on a displacement caused by body motion of the subject SU detected by the body motion detecting section 25.

In the present embodiment, the raw data selecting section 26 selects the imaging data as raw data based on a first displacement N1 and a second displacement N2 of the diaphragm of the subject SU caused by respiratory motion detected by the body motion detecting section 25.

In particular, first, based on the first navigator echo data acquired by the scanning section 2 performing the first navigator sequence NS1 as described above, a displacement of the diaphragm moved by respiratory motion before the scanning section 2 performs the imaging sequence IS is determined as first displacement N1 by the body motion detecting section 25. Specifically, the first navigator echo data is subjected to one-dimensional inverse Fourier transformation to generate a profile of the region containing the diaphragm, and a displacement of the diaphragm is determined from the profile as first displacement N1 by the body motion detecting section 25. In the present embodiment, a portion in the generated profile that has high signal intensity corresponds to the abdomen, that having low signal intensity corresponds to the thorax, and a border portion between the portions representing the abdomen and thorax corresponds to the diaphragm; thus, a position at which the border portion corresponding to the diaphragm has moved in the body axis direction is determined as first displacement N1 by the body motion detecting section 25.

Similarly to the first displacement N1, based on the second navigator echo data acquired by the scanning section 2 performing the second navigator sequence NS2, a displacement of the diaphragm moved by respiratory motion after the scanning section 2 has performed the imaging sequence IS is determined as second displacement N2 by the body motion detecting section 25.

Thereafter, a decision is made as to whether the imaging data acquired by the imaging sequence IS between the first navigator sequence NS1 and second navigator sequence NS2 performed for detecting the first displacement N1 and second displacement N2 should be selected as raw data by the raw data selecting section 26 based on the first displacement N1 and second displacement N2 determined by the body motion detecting section 25 as described above.

Figure 5:
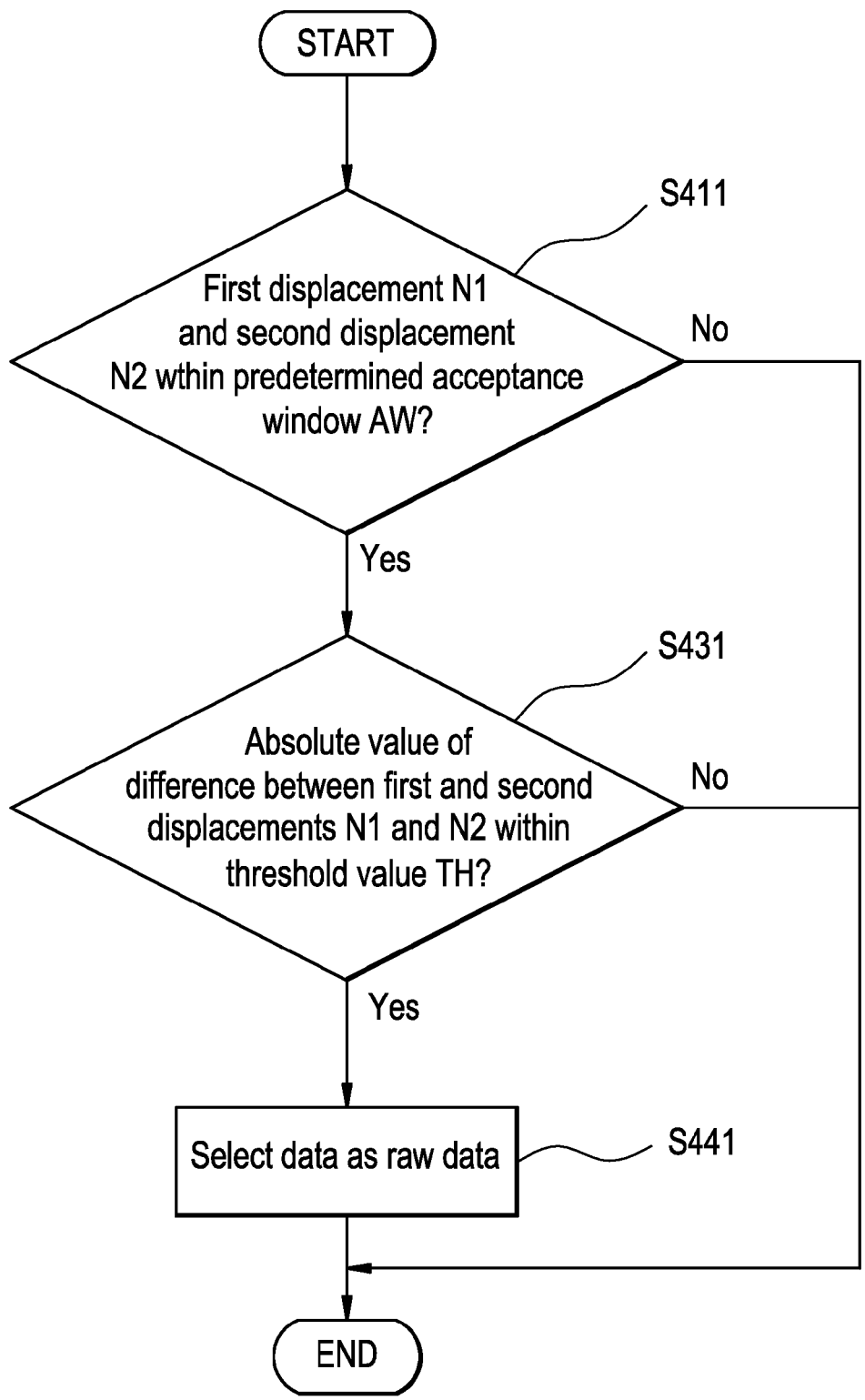
FIG. 5 is a flow chart showing an operation in selecting imaging data as raw data by the raw data selecting section 26 in the present embodiment.

FIG. 5 is a flow chart showing an operation in selecting imaging data as raw data by the raw data selecting section 26 in the present embodiment.

First, as shown in FIG. 5, a decision is made as to whether the first displacement N1 and second displacement N1 fall within an acceptance window AW (S411).

Specifically, a decision is made by the raw data selecting section 26 as to whether the first displacement N1 of the diaphragm moved by respiratory motion before the scanning section 2 performs the imaging sequence IS falls within the predefined acceptance window AW, and a decision is made by the raw data selecting section 26 as to whether the second displacement N2 of the diaphragm moved by respiratory motion after the scanning section 2 has performed the imaging sequence IS falls within the predefined acceptance window AW.

Figure 6A:
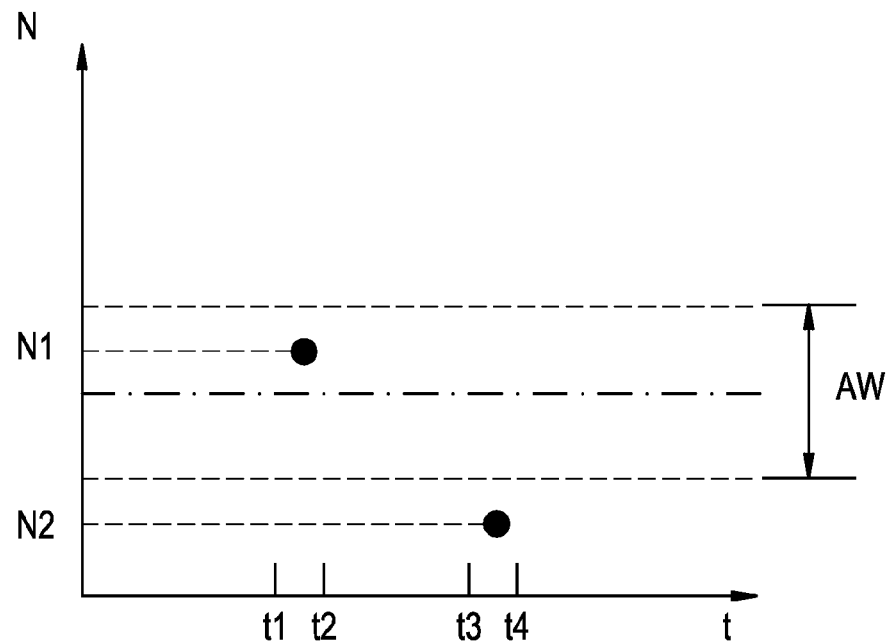
FIGS. 6a and 6b are diagrams showing the process of deciding whether a first displacement N1 and a second displacement N2 fall within an acceptance window AW.
Figure 6B:
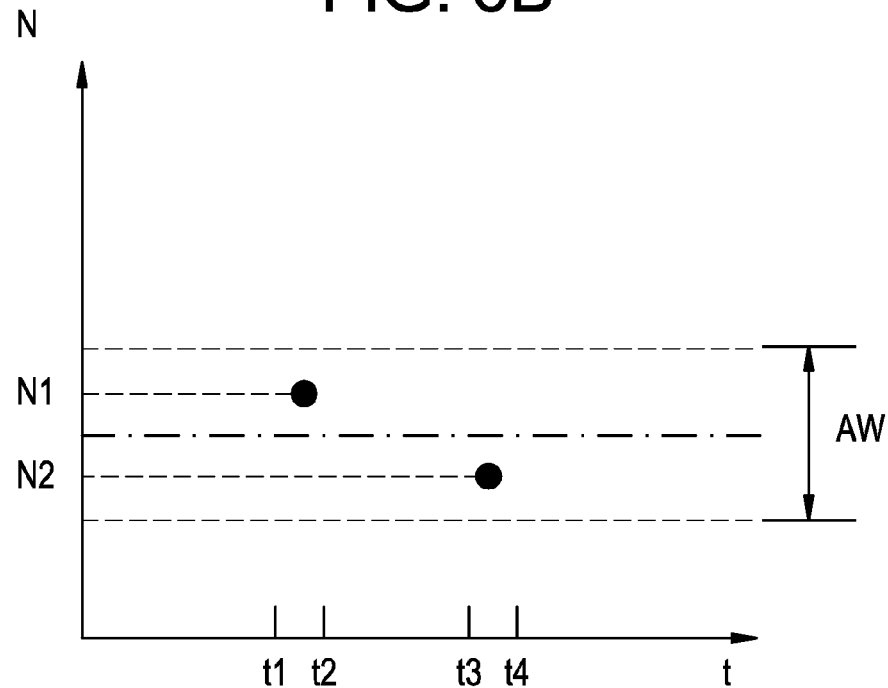

FIG. 6 is a diagram showing the process of deciding whether the first displacement N1 and second displacement N2 fall within the acceptance window AW, wherein the horizontal axis represents a time axis t, and the vertical axis represents a displacement N of the diaphragm. In the drawing, FIG. 6(*a*) shows the first displacement N1 or second displacement N2 falling outside the acceptance window AW, and FIG. 6(*b*) shows the first displacement N1 and second displacement N2 falling within the acceptance window AW.

When the first displacement N1 or second displacement N2 falls outside the predefined acceptance window AW (No) as shown in FIG. 6(*a*), magnetic resonance signals acquired as imaging data in the imaging sequence IS in the scan S are not selected as raw data, as shown in FIG. 5.

On the other hand, if the first displacement N1 and second displacement N2 fall within the predefined acceptance window AW (Yes) as shown in FIG. 6(*b*), then a decision is made as to whether an absolute value A of a difference between the first displacement N1 and second displacement N2 falls within a predetermined threshold value (S431), as shown in FIG. 5.

Specifically, the raw data selecting section 26 decides whether the absolute value A of the difference between the first displacement N1 and second displacement N2 falls within a predetermined threshold value TH.

Figure 7A:
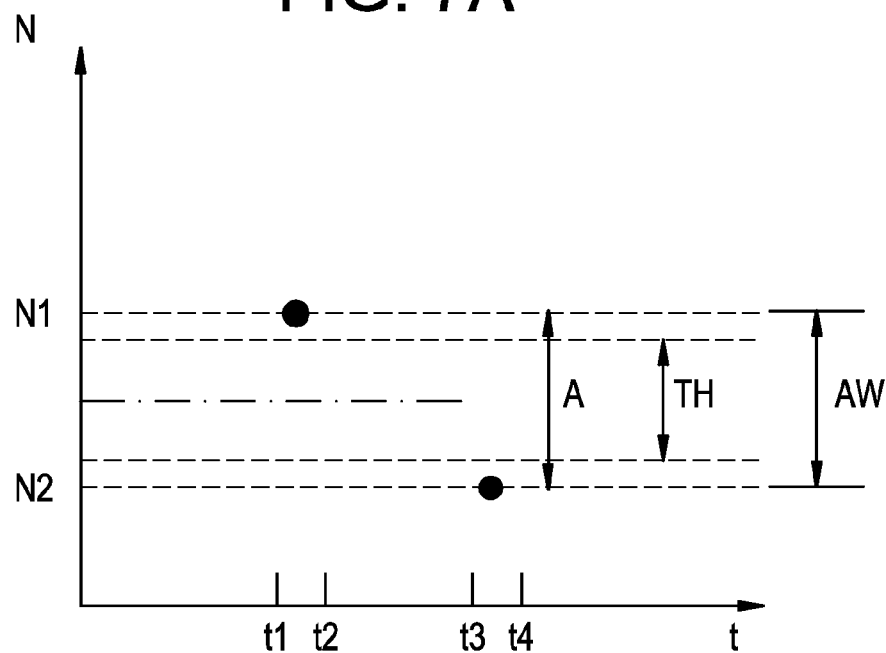
FIGS. 7a and 7b are diagrams showing the process of deciding whether an absolute value A of a difference between the first displacement N1 and second displacement N2 falls within a predetermined threshold value TH in the present embodiment.
Figure 7B:
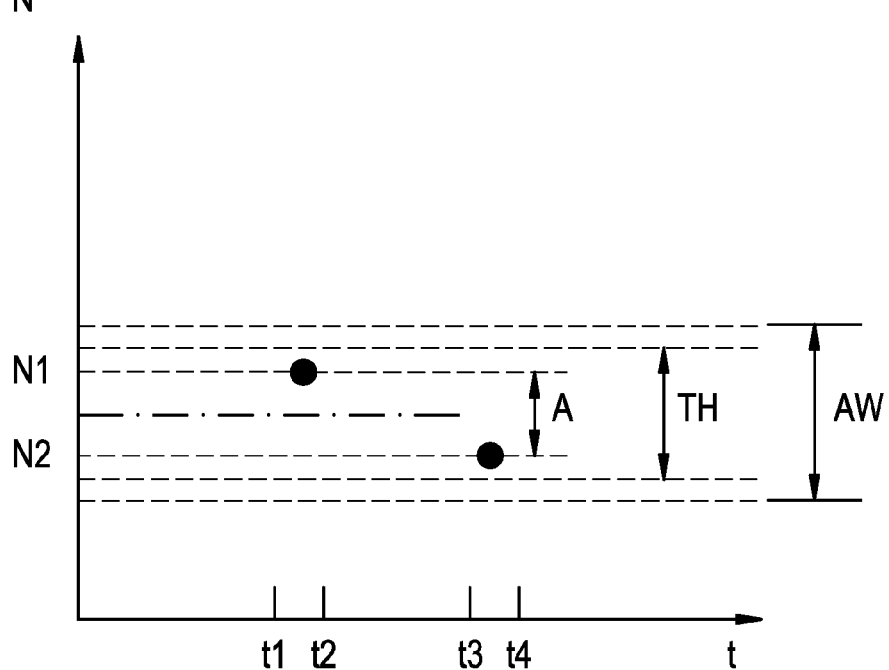

FIG. 7 is a diagram showing the process of deciding whether the absolute value A of the difference between the first displacement N1 and second displacement N2 falls within the predetermined threshold value TH in the present embodiment, wherein the horizontal axis represents a time axis t, and the vertical axis represents a displacement N of the diaphragm. In the drawing, FIG. 7(a) shows the absolute value A of the difference between the first displacement N1 and second displacement N2 exceeding the predetermined threshold value TH, and FIG. 7(b) shows the absolute value A of the difference between the first displacement N1 and second displacement N2 falling within the predetermined threshold value TH.

If the absolute value A of the difference between the first displacement N1 and second displacement N2 exceeds the predetermined threshold value TH (No) as shown in FIG. 7(a), magnetic resonance signals acquired as imaging data in the imaging sequence IS in the scan S are not selected as raw data.

On the other hand, if the absolute value A of the difference between the first displacement N1 and second displacement N2 falls within the predetermined threshold value (Yes) as shown in FIG. 7(b), magnetic resonance signals acquired as imaging data in the imaging sequence IS in the scan S are selected as raw data (S441) as shown in FIG. 5.

Thus, if the first displacement N1 and second displacement N2 of the subject SU before and after the imaging data is obtained in each scan S fall within the predetermined acceptance window AW, and the absolute value A of the difference between the first displacement N1 and second displacement N2 falls within the predetermined threshold value TH (Yes), the raw data selecting section 26 selects, as raw data, imaging data acquired by the imaging sequence IS performed between detection of the first displacement N1 and second displacement N2 in that scan S, as shown in FIG. 2. Then, as shown in FIG. 2, if the raw data selecting section 26 does not select the imaging data acquired by the imaging sequence IS as raw data (No), the first navigator sequence is performed (S11), the imaging sequence is performed (S21), and the second navigator sequence is performed (S31). In this case, the imaging sequence IS is performed again so as to correspond to a phase encoding step of the imaging sequence IS that is not selected as raw data, for example.

Next, raw data is saved (S42), as shown in FIG. 2.

Specifically, the imaging data selected as raw data as described above is stored and saved by the raw data selecting section 26.

Next, a decision is made as to whether acquisition of raw data has been completed (S51), as shown in FIG. 2.

Specifically, the control section 30 decides whether all raw data corresponding to a matrix of a slice image to be produced have been acquired by the raw data selecting section 26. For example, a decision is made as to whether raw data corresponding to all phase encoding steps in the k-space have been acquired. If not all raw data are acquired by the raw data selecting section 26 (No), the control section 30 controls the relevant components to continue the scan on the subject SU.

On the other hand, if all raw data have been acquired by the raw data selecting section 26 (Yes), a slice image is produced (S61), as shown in FIG. 2.

Specifically, the image producing section 31 reconstructs a slice image of a slice through the subject SU from the imaging data selected as raw data by the raw data selecting section 26. The image producing section 31 then outputs the reconstructed image to the display section 33.

As described above, according to the present embodiment, the body motion detecting section 25 detects, as displacement caused by respiratory motion of a subject, a first displacement N1 of the diaphragm before the scanning section 2 performs an imaging sequence IS and a second displacement N2 of the diaphragm after the scanning section 2 has performed the imaging sequence IS. Specifically, the scanning section 2 performs a first navigator sequence NS1 to acquire magnetic resonance signals for a region containing the diaphragm as first navigator echo data before performing the imaging sequence IS, and the scanning section 2 also performs a second navigator sequence NS2 to acquire magnetic resonance signals for the region containing the diaphragm as second navigator echo data after performing the imaging sequence IS. The body motion detecting section 25 then detects a first displacement N1 of the diaphragm based on the first navigator echo data acquired by the scanning section 2 performing the first navigator sequence NS1, and the body motion detecting section 25 also detects a second displacement N2 of the diaphragm based on the second navigator echo data acquired by the scanning section 2 performing the second navigator sequence NS2. Thereafter, the raw data selecting section 26 selects the imaging data as raw data based on the first displacement N1 and second displacement N2 of the diaphragm detected by the body motion detecting section 25. Specifically, if the first displacement N1 and second displacement N2 of the subject SU when acquiring the imaging data fall within a predetermined acceptance window, and an absolute value of a difference between the first displacement N1 and second displacement N2 falls within a predetermined specified value, the imaging data is selected as raw data by the raw data selecting section 26. The image producing section 31 then produces a slice image of the subject based on the imaging data selected as raw data by the raw data selecting section 26.

Thus, according to the present embodiment, based on displacements N1 and N2 of the diaphragm acquired by first and second navigator sequences NS1 and NS2 performed before and after an imaging sequence IS, arrhythmic respiratory motion is detected when, for example, the depth of respiration is significantly disturbed and varies, and imaging data acquired under rhythmic respiratory motion can be selected as raw data to reconstruct a slice image. Therefore, the present embodiment is capable of suppressing development of motion artifacts and improving image quality.

It should be noted that the magnetic resonance imaging apparatus 1 in the embodiment above corresponds to the magnetic resonance imaging apparatus of the present invention. The scanning section 2 in the embodiment above corresponds to the scanning section of the present invention. The body motion detecting section 25 in the embodiment above corresponds to the body motion detecting section of the present invention. The raw data selecting section 26 in the embodiment above corresponds to the raw data selecting section of the present invention. The image producing section 31 in the embodiment above corresponds to the image producing section of the present invention. Finally, the display section 33 in the embodiment above corresponds to the display section of the present invention.

The present invention is not limited to being practiced in the aforementioned embodiment, and several variations may be employed.

For example, the navigator sequence may be performed according to any one of various imaging techniques, besides the spin echo technique.

Moreover, for example, body motion of the subject is not limited to being detected by a navigator sequence. For example, respiratory motion may be detected by fitting a belt around the thorax of the subject and detecting extension/contraction of the belt.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising:
a scanning device configured to repetitively perform an imaging sequence in which an electromagnetic wave is emitted toward a subject in a static magnetic field space to excite an imaged region in the subject, and magnetic resonance signals generated in the imaged region in the subject are acquired as imaging data;
a body motion detecting device configured to repetitively detect a displacement caused by body motion of the subject each time said scanning device performs the imaging sequence;
a raw data selecting device configured to select the imaging data acquired by said scanning device performing the imaging sequence as raw data based on the displacement caused by body motion of the subject detected by said body motion detecting device; and
an image producing device configured to produce an image of the subject based on the imaging data selected as raw data by said raw data selecting device,
wherein said body motion detecting device is configured to detect, as the displacement caused by body motion of the subject, a first displacement before said scanning device performs the imaging sequence and a second displacement after said scanning device has performed the imaging sequence, and
said raw data selecting device is configured to select the imaging data as raw data based on the first displacement detected by said body motion detecting device and the second displacement detected by said body motion detecting device.

2. The magnetic resonance imaging apparatus of claim 1, wherein:
if the first displacement and the second displacement fall within a specified range, said raw data selecting device is configured to select imaging data corresponding to the first displacement and the second displacement within the specified range as raw data.

3. The magnetic resonance imaging apparatus of claim 1, wherein:
said raw data selecting device is configured to calculate an absolute value of a difference between the first displacement and the second displacement, and to select the imaging data as raw data based on the calculated absolute value.

4. The magnetic resonance imaging apparatus of claim 1, wherein:
if an absolute value of the difference between the first displacement and the second displacement falls within a specified value, said raw data selecting device is configured to select imaging data as raw data.

5. The magnetic resonance imaging apparatus of claim 1, wherein:
said body motion detecting device is configured to detect a displacement of the subject caused by respiratory motion.

6. The magnetic resonance imaging apparatus of claim 1, wherein:
said scanning device is configured to repetitively perform the imaging sequence for each cardiac cycle of the subject; and
said body motion detecting device is configured to detect the first displacement and the second displacement for each cardiac cycle of the subject.

7. The magnetic resonance imaging apparatus of claim 6, wherein:
said scanning device is configured to repetitively perform the imaging sequence at a first phase over a plurality of cardiac cycles of the subject; and
said body motion detecting device is configured to repetitively detect the first displacement at the first phase over the plurality of cardiac cycles of the subject, and to repetitively detect the second displacement at the first phase over the plurality of cardiac cycles of the subject.

8. The magnetic resonance imaging apparatus of claim 1, wherein:
said scanning device is configured to perform a first navigator sequence in order to acquire the magnetic resonance signals as first navigator echo data before performing the imaging sequence, and to perform a second navigator sequence in order to acquire the magnetic resonance signals as second navigator echo data after performing the imaging sequence; and
said body motion detecting device is configured to detect the first displacement based on the first navigator echo data acquired by said scanning device during the first navigator sequence, and to detect the second displacement based on the second navigator echo data acquired by said scanning device during the second navigator sequence.

9. The magnetic resonance imaging apparatus of claim 8, wherein:
said scanning device is configured to perform the first navigator sequence and the second navigator sequence in order to acquire the first navigator echo data and the second navigator echo data for a region containing the diaphragm of the subject.

10. The magnetic resonance imaging apparatus of claim 1, further comprising:
a display device comprising a display screen configured to display an image of the subject produced by said image producing device.

11. A method for reducing imaging artifacts in a magnetic resonance image, said method comprising:
performing an imaging sequence in which an electromagnetic wave is emitted toward a subject in a static magnetic field space to excite an imaged region in the subject;
detecting a displacement of the subject for each imaging sequence performed;
selecting raw imaging data that is acquired during the performed imaging sequence based on the displacement of the subject caused by a body motion of the subject; and
producing an image of the subject based on the selected raw imaging data.

12. A method in accordance with claim 11, wherein detecting a displacement of the subject further comprises:
detecting a first displacement of the subject caused by a first body motion of the subject prior to performing the imaging sequence;
detecting a second displacement of the subject caused by a second body motion of the subject after the imaging sequence is performed; and
selecting the raw data based on the first displacement and the second displacement.

13. A method in accordance with claim 12, further comprising detecting the first displacement of the subject caused by a body motion of the subject prior to performing the imaging sequence when the first displacement falls within a specified range; and selecting the raw data based when the first displacement is within the specified range.

14. A method in accordance with claim 12, further comprising detecting the second displacement of the subject caused by a body motion of the subject prior to performing the imaging sequence when the second displacement falls within a specified range; and selecting the raw data based when the second displacement is within the specified range.

15. A method in accordance with claim 12, further comprising:

calculating an absolute value of a difference between the first displacement and the second displacement; and selecting the imaging data raw data based on the calculated absolute value.

16. A method in accordance with claim 15, further comprising:

determining if the absolute value of the difference between the first displacement and the second displacement falls within a specified value; and selecting the imaging data as raw data based on the determined absolute value.

17. A method in accordance with claim 11, wherein detecting a displacement of the subject further comprises detecting the displacement of the subject caused by respiratory motion.

18. A method in accordance with claim 11, further comprising:

performing the imaging sequence for each cardiac cycle of the subject; and detecting a displacement of the subject for each cardiac cycle of the subject.

19. A method in accordance with claim 18, further comprising:

performing the imaging sequence at the same phase in each cardiac cycle of the subject; and detecting a displacement of the subject for each phase in the cardiac cycle of the subject.

20. A method in accordance with claim 18, further comprising:

performing a first navigator sequence to acquire a plurality of magnetic resonance signals as first navigator echo data before performing the imaging sequence;

performing a second navigator sequence to acquire a plurality of magnetic resonance signals after performing the imaging sequence; and detecting the first displacement based on the first navigator echo data acquired; and detecting the second displacement based on the second navigator echo data acquired.

* * * * *